(12) United States Patent
Ishikawa

(10) Patent No.: US 8,690,587 B2
(45) Date of Patent: Apr. 8, 2014

(54) CONNECTION TERMINAL

(75) Inventor: Shigeki Ishikawa, Kanagawa (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 94 days.

(21) Appl. No.: 13/517,336

(22) PCT Filed: Dec. 21, 2010

(86) PCT No.: PCT/JP2010/073021
§ 371 (c)(1),
(2), (4) Date: Jun. 20, 2012

(87) PCT Pub. No.: WO2011/078176
PCT Pub. Date: Jun. 30, 2011

(65) Prior Publication Data
US 2012/0264318 A1    Oct. 18, 2012

(30) Foreign Application Priority Data

Dec. 25, 2009  (JP) ................................. 2009-296212

(51) Int. Cl.
*H01R 4/48*    (2006.01)
(52) U.S. Cl.
USPC .......................................................... 439/66
(58) Field of Classification Search
USPC ............... 439/816, 131, 700, 66, 67, 76, 246
See application file for complete search history.

(56) References Cited

U.S. PATENT DOCUMENTS

| 7,256,593 | B2 * | 8/2007 | Treibergs | 324/754.05 |
| 7,467,952 | B2 * | 12/2008 | Hsiao et al. | 439/66 |
| 7,841,864 | B2 * | 11/2010 | Hsiao et al. | 439/66 |
| 7,862,391 | B2 * | 1/2011 | Johnston et al. | 439/824 |

(Continued)

FOREIGN PATENT DOCUMENTS

| JP | 2003-172748 A | 6/2003 |
| JP | 3129847 U | 2/2007 |

(Continued)

OTHER PUBLICATIONS

International Search Report dated Jan. 25, 2011, issued for PCT/JP2010/073021.

*Primary Examiner* — Neil Abrams
*Assistant Examiner* — Phuongchi T Nguyen
(74) *Attorney, Agent, or Firm* — Edwards Wildman Palmer LLP

(57) ABSTRACT

A connection terminal includes a first contact member that has a conductive property, that has an approximately plate shape, and that includes a tip portion, a tip of which is sharply pointed; a base end portion, a width of which is less than a width of the tip portion and which extends from a base end of the tip portion; and a protrusion protruding in a direction perpendicular to one plane of the base end portion. The connection terminal also includes a second contact member that has a conductive property, that has an approximately plate shape, and that includes a tip portion, a tip of which is sharply pointed; and a base end portion, a width of which is less than a width of the tip portion and which extends from a base end of the tip portion. The second contact member slides against the protrusion in a direction in which the base end portion extends. The connection terminal also includes a coil spring that surrounds the base end portions and biases the first contact member and the second contact member toward the tip portions sides, respectively.

13 Claims, 11 Drawing Sheets

(56) References Cited

U.S. PATENT DOCUMENTS

| | | |
|---|---|---|
| 7,878,867 B2 * | 2/2011 | Lin .................................. 439/700 |
| 7,946,855 B2 * | 5/2011 | Osato ................................ 439/66 |
| 8,157,601 B2 * | 4/2012 | Lin et al. ......................... 439/700 |
| 8,366,496 B2 * | 2/2013 | Hsu et al. ........................ 439/824 |
| 2006/0073710 A1 | 4/2006 | Hwang |
| 2006/0279301 A1 | 12/2006 | Treibergs |
| 2008/0064236 A1 * | 3/2008 | Lin et al. ........................... 439/82 |
| 2009/0075529 A1 | 3/2009 | Johnston et al. |
| 2010/0068947 A1 * | 3/2010 | Hsiao et al. .................... 439/786 |
| 2010/0120299 A1 * | 5/2010 | Osato ............................. 439/786 |

FOREIGN PATENT DOCUMENTS

| | | |
|---|---|---|
| JP | 2008-032743 A | 2/2008 |
| JP | 2008-516398 A | 5/2008 |
| JP | 2008-546164 A | 12/2008 |
| JP | 2009-122085 A | 6/2009 |
| JP | 2010-151732 A | 7/2010 |
| JP | 2010-539672 A | 12/2010 |

* cited by examiner

CONNECTION TERMINAL

FIELD

The present invention relates to a connection terminal used for connecting electrical circuit boards etc. to each other.

BACKGROUND

Conventionally, in the field of technology related to an electrical characteristics test on a test object, such as a semiconductor integrated circuit, there is a known technology related to a connection terminal unit, which includes a plurality of connection terminals arranged according to a semiconductor integrated circuit and which has a function of ensuring electrical continuity by bringing the connection terminals into physical contact with the semiconductor integrated circuit. Such a connection terminal has a structure that includes at least a plurality of connection terminals and a connection terminal holder for supporting the connection terminals.

Each of the connection terminals described above includes two conductive contact members arranged at both ends thereof, and the contact members are coupled with each other by a coupling unit having a concavo-convex shape and are biased in the longitudinal direction of the contact members by a coil spring. Each of the connection terminals is extendable and retractable by the coil spring so as to come in contact with the semiconductor integrated circuit and can reduce a shock caused by a contact between each of the contact members and the semiconductor integrated circuit. The force applied to the semiconductor integrated circuit by the coil spring enables the contact members to assuredly come into contact with the semiconductor integrated circuit.

As the connection terminals described above, for example, there is disclosed a connection terminal that can increase the length of an electrical connection portion without reducing the volume of a spring (see, for example, Patent Literature 1). Furthermore, a connection terminal of a low profile type is disclosed (see, for example, Patent Literature 2).

CITATION LIST

Patent Literature

Patent Literature 1: Japanese Translation of PCT International Application Publication No. 2008-546164
Patent Literature 2: Japanese Patent Application Laid-open No. 2009-122085

SUMMARY

Technical Problem

However, in the conventional connection terminals disclosed in Patent Literatures 1 and 2, which are structured such that the two contact members are coupled with each other, it is necessary to strictly manage the diameters of a shaft and a tube for housing the shaft or the diameter of a contact protrusion formed on the shaft. Therefore, it is difficult to manufacture or assemble the components.

The present invention has been made in view of the above, for the foregoing reasons, there is a need for a connection terminal that has a simple structure, that can easily be assembled, and that can ensure a conductive property.

Solution to Problem

A connection terminal according to an aspect of the present invention includes: a first contact member that has a conducive property and that has an approximately plate shape, the first contact member including: a first tip portion, a tip of which is sharply pointed; a first base end portion, a width of which is less than a width of the first tip portion and which extends from a base end of the first tip portion; and a protrusion protruding in a direction perpendicular to one plane of the base end portion; a second contact member that has a conducive property and that has an approximately plate shape, the second contact member including: a second tip portion, a tip of which is sharply pointed; and a second base end portion, a width of which is less than a width of the second tip portion and which extends from a base end of the second tip portion, wherein the second contact member slides against the protrusion in a direction in which the second base end portion extends; and a coil spring that surrounds the first base end portion and the second base end portion and biases the first contact member and the second contact member toward the first tip portion and the second tip portion, respectively, wherein one of the protrusion and the second base end portion surrounds at least a part of an outer circumference of the other one of the protrusion and the second base end portion.

In the connection terminal according to the present invention as set forth in the invention described above, the second contact member includes a recess with which the protrusion is fitted such that the protrusion can slide in the direction in which the second base end portion extends.

In the connection terminal according to the present invention as set forth in the invention described above, a bottom surface of the recess is open.

In the connection terminal according to the present invention as set forth in the invention described above, different-level planes are provided at a boundary between the first end portion and the first base end portion and between the second end portion and the second base end portion, each of the different-level planes including a notch portion in a shape corresponding to a winding of the coil spring.

In the connection terminal according to the present invention as set forth in the invention described above, one end of the coil spring is in contact with one plane of the first tip portion and the other end of the coil spring is in contact with one plane of the second end portion.

In the connection terminal according to the present invention as set forth in the invention described above, a part of an inner surface of the coil spring is in contact with a surface of the protrusion that is not in contact with the second contact member.

In the connection terminal according to the present invention as set forth in the invention described above, a part of the inner surface of the coil spring is in contact with a surface of the first contact member being not in contact with the second contact member and is in contact with a surface of the second contact member being not in contact with the first contact member.

In the connection terminal according to the present invention as set forth in the invention described above, when the coil spring is separated from one of the first contact member and the second contact member and is most retracted toward the other one of the first contact member and the second contact member, a distance from a tip of the other one of the first contact member and the second contact member to an end of the coil spring is less than a maximum value of a distance from a tip of the other one of the first contact member and the second contact member to a fitted portion between the first contact member and the second contact member.

In the connection terminal according to the present invention as set forth in the invention described above, a surface of each of the first base end portion and the second base end portion, the surface being not in contact with the first base end portion or the second base end portion and being parallel to the longitudinal direction, is chamfered.

In the connection terminal according to the present invention as set forth in the invention described above, at least portions of the coil spring in contact with the first contact member and the second contact member have insulation properties.

In the connection terminal according to the present invention as set forth in the invention described above, an entire surface of the coil spring has an insulation property.

In the connection terminal according to the present invention as set forth in the invention described above, each of the first base end portion and the second base end portion is a clad material, in which a sliding portion and a conductive portion are deposited one on top of the other, wherein the sliding portion is made of noble metal or noble metal array and is in contact with the first base end portion and the second base end portion, and the conductive portion is made of a conductive material and with which the first base end portion and the second base end portion does not come in contact.

Advantageous Effects of Invention

The connection terminal according to the present invention includes contact members, one of which has a protrusion and the other of which has a recess in a direction perpendicular to the longitudinal direction of the contact members, and the protrusion and the recess are fitted with each other to bring the contact members into surface contact with each other. Therefore, it is possible to easily bring the contact members into contact with each other, assuredly maintain the conductivity, and make manufacturing of the components easy.

DESCRIPTION OF EMBODIMENTS

Figure 1:
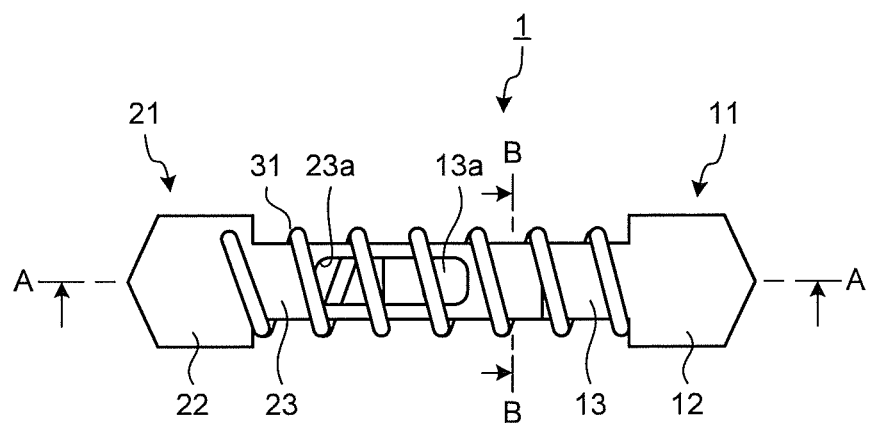
FIG. 1 is a plan view illustrating a configuration of a connection terminal according to a first embodiment of the present invention.

Exemplary embodiments of the present invention will be explained in detail below with reference to the accompanying drawings. The present invention is not limited by the embodiments below. In the drawings referred to in the explanation below, shapes, sizes, and positional relationships of components are schematically illustrated to the extent that the details of the present invention is understood. Therefore, the present invention is not limited by the shapes, the sizes, and the positional relationships of the components exemplified in the drawings.

First Embodiment

Figure 2:
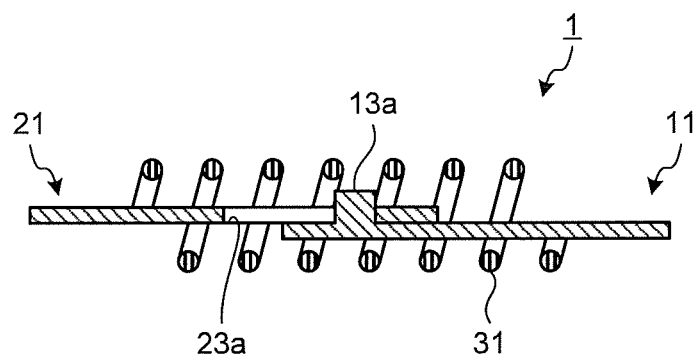
FIG. 2 is a cross-sectional view of the connection terminal illustrated in FIG. 1, taken along a line A-A.
Figure 3:
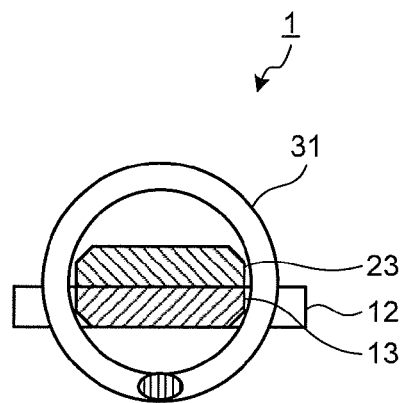
FIG. 3 is a cross-sectional view of the connection terminal illustrated in FIG. 1, taken along a line B-B.

FIG. 1 is a plan view illustrating a configuration of a connection terminal 1 according to a first embodiment of the present invention. FIG. 2 is a cross-sectional view of the connection terminal 1 illustrated in FIG. 1, taken along a line A-A. FIG. 3 is a cross-sectional view of the connection terminal 1 illustrated in FIG. 1, taken along a line B-B. The connection terminal 1 illustrated in FIG. 1 to FIG. 3 comes in contact with connection objects at both ends thereof to establish electrical continuity between the connection objects.

The connection terminal 1 includes a first contact member 11, which has an approximately plate shape, which has a conductive property, and one end of which can be brought into contact with and electrically connected to a connection object; a second contact member 21, which has an approximately plate shape, which has a conductive property, one end of which can be brought into contact with and electrically connected to a connection object, and which can establish electrical continuity between connection objects by being coupled with the first contact member 11; and an extendable-retractable coil spring 31, which applies a biasing force along the longitudinal directions of the first contact member 11 and the second contact member 21.

The first contact member 11 includes a tip portion 12 as a first tip portion that comes in contact with a connection object to establish an electrical connection; and a base end portion 13 as a first base end portion that comes in contact with the second contact member 21 to enable an electrical connection with the second contact member 21. The tip portion 12 has a polygonal shape, a tip of which in the longitudinal direction of the first contact member 11 is sharply pointed. The base end portion 13 is a flat plate having an approximately rectangular solid shape extending from a base end of the tip portion 12. The length (width) of the base end portion 13 in a direction perpendicular to the longitudinal direction is less than the width of the tip portion 12. The base end portion 13 includes a protrusion 13a, which has an approximately bar shape and which protrudes in a direction perpendicular to a plane of the plate. As illustrated in FIG. 3, a surface of the base end portion 13 that is not in contact with the second contact member 21 has chamfered edges in a direction parallel to the longitudinal direction of the base end portion 13. At the boundary between the tip portion 12 and the base end portion 13, walls of the tip portion 12 extend in the longitudinal direction from both ends of the boundary of the base end portion 13, so that different-level planes are formed. The first contact member 11 has a mirror-symmetric shape with respect to the cross section taken along the line A-A.

The second contact member 21 includes a tip portion 22 as a second tip portion that comes in contact with a connection object to establish an electrical connection; and a base end portion 23 as a second base end portion that comes in contact with the first contact member 11 to enable an electrical connection with the first contact member 11. The tip portion 22 has a polygonal shape, a tip of which in the longitudinal direction of the second contact member 21 is sharply pointed. The base end portion 23 is a flat plate having an approximately rectangular solid shape extending from a base end of the tip portion 22. The length (width) of the base end portion 23 in a direction perpendicular to the longitudinal direction is less than the width of the tip portion 22. The base end portion 23 includes a recess 23a, which has approximately the same width as the width of the protrusion 13a and with which the protrusion 13a is fitted such that the protrusion 13a can slid in the longitudinal direction of the base end portion 23. The recess 23a extends in the longitudinal direction in accordance with a moving range of the first contact member 11. The bottom surface of the recess 23a is open. As illustrated in FIG. 3, a surface of the base end portion 23 that is not in contact with the first contact member 11 has chamfered edges in a direction parallel to the longitudinal direction of the base end portion 23. At the boundary between the tip portion 22 and the base end portion 23, walls of the tip portion 22 extend in the longitudinal direction from both ends of the boundary of the base end portions 23, so that different-level planes are formed. The second contact member 21 has a mirror-symmetric shape with respect to the cross section taken along the line A-A.

Figure 4:
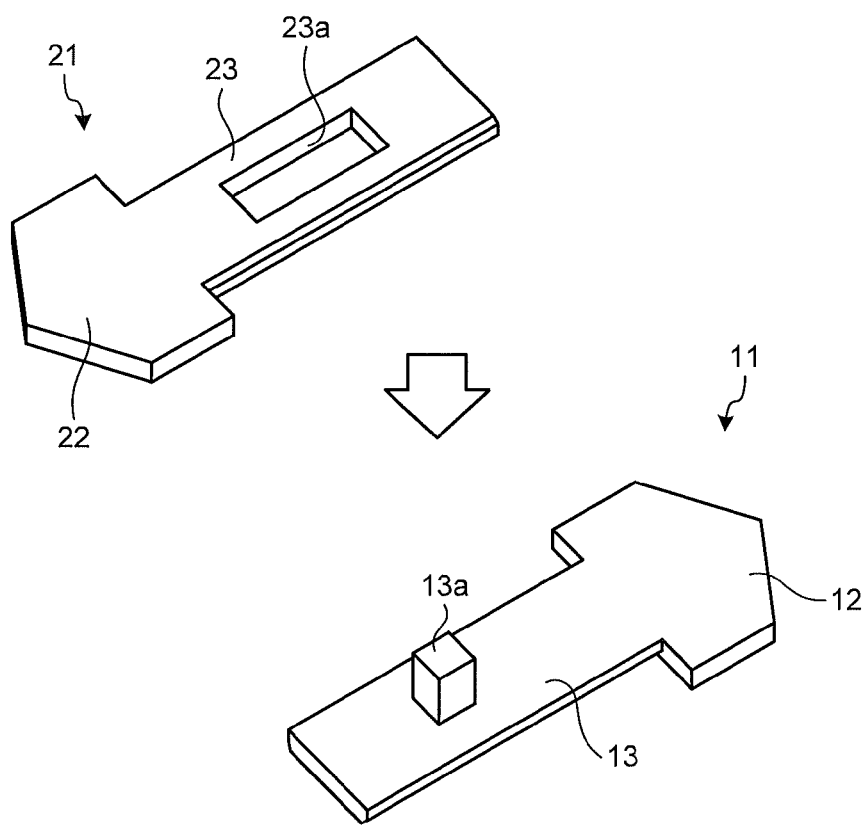
FIG. 4 is an exploded perspective view illustrating configurations of main components of the connection terminal illustrated in FIG. 1.

FIG. 4 is an exploded perspective view illustrating configurations of main components of the connection terminal 1 illustrated in FIG. 1. The first contact member 11 and the second contact member 21 are coupled with each other by fitting the protrusion 13a and the recess 23a with each other such that the inner wall of the recess 23a surrounds the outer surface of the protrusion 13a, so that opposing planes of the base end portions 13 and 23 come in contact with each other and electrical continuity is enabled.

As illustrated in FIG. 3, the coil spring 31 is made of a wire rod wound in a circular shape. The diameter of the inner circumference of the circle is greater than the width of each of the base end portions 13 and 23 and is less than the width of each of the tip portions 12 and 22. As illustrated in FIG. 1 to FIG. 3, the coil spring 31 surrounds the base end portions 13 and 23 while the first contact member 11 and the second contact member 21 are fitted with each other. One end side of the coil spring 31 is in contact with the different-level planes of the first contact member 11 and applies an elastic force toward the tip portion 12 of the first contact member 11. Similarly, the other end side of the coil spring 31 is in contact with the different-level planes of the second contact member 21 and applies an elastic force toward the tip portion 22 of the second contact member 21.

As illustrated in FIG. 2, one end portion of the coil spring 31 is in contact with one plane of the first contact member 11 and the other end portion of the coil spring 31 is in contact with one plane of the second contact member 21. The coil spring 31 applies a force component in a direction perpendicular to the contact surfaces as one of forces applied to the contact surfaces; therefore, it becomes possible to prevent the first contact member 11 and the second contact member 21 from rotating around the protrusion 13a and/or from being separated from each other due to a torsion between the first contact member 11 and the second contact member 21. While the contact state is employed in the first embodiment, it is possible not to bring the coil spring and the contact members into contact with each other depending on the thicknesses of the contact members, the property of the coil spring, or the like.

At least portions of the coil spring 31 that are in contact with the first contact member 11 and the second contact member 21 have insulation properties. The insulation properties can be ensured by coating target portions of the coil spring 31 with insulating resin, such as enamel, or by forming a coil-shaped wire rod with insulating resin. It is also possible to coat the entire surface of the coil spring 31 with insulating resin, such as enamel. By coating the entire surface of the coil spring 31, it is possible to prevent a reduction in current-carrying capacity due to heat caused by impedance of the coil when an electric current flows through the coil spring.

Figure 5:
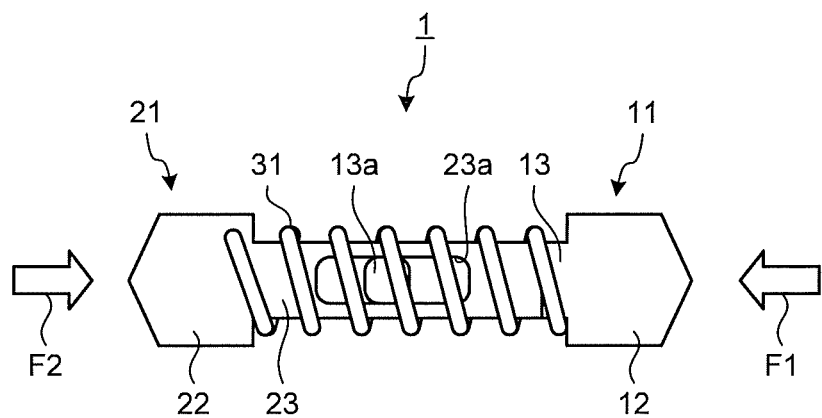
FIG. 5 is a plan view of the connection terminal according to the first embodiment of the present invention.

A case is explained below with reference to FIG. 5 in which forces are applied to both ends of the connection terminal 1. FIG. 5 is a plan view of the connection terminal 1 according to the first embodiment of the present invention. When forces F1 and F2 toward the base end portions 13 and 23 (in the arrow directions in FIG. 5) are applied to the tip portions 12 and 22 of the connection terminal 1, respectively, along the longitudinal direction of the connection terminal 1 illustrated in FIG. 5, the protrusion 13a slides inside the recess 23a along the longitudinal direction. At this time, the coil spring 31 is compressed and applies elastic forces in directions opposite to the respective directions of applying the forces F1 and F2, via the different-level planes of the first contact member 11 and the second contact member 21. The coil spring 31 is extended or retracted by the force applied from the outside, thereby reducing shock and applying elastic forces in the directions opposite to the respective directions of the applied forces. Consequently, a contact state between the connection objects can be ensured.

In the connection terminal 1 configured as above, when the tip portions 12 and 22 are brought into contact with respective connection objects, the coil spring 31 retracts to absorb a load caused by the contact and applies elastic forces to the connection objects via the different-level planes in the directions opposite to the respective directions of the forces applied by the connection objects. Therefore, it is possible to ensure the contact with the connection objects and enable the electrical continuity between the connection objects being in contact with the both ends of the connection terminal 1. Furthermore, the first contact member 11 and the second contact member 21 are in surface contact with each other and the contact portions between the coil spring 31 and the first contact member 11 and between the coil spring 31 and the second contact member 21 are electrically isolated. Therefore, it is possible to assuredly realize the electrical continuity between the contact members via the shortest route.

It is preferable to form the protrusion 13a such that the protrusion 13a comes in contact with the wall surfaces of the recess 23a in the longitudinal direction of the base end portion 23. In particular, it is preferable to form the protrusion 13a such that three side walls of the protrusion 13a come in contact with the side walls of the recess 23a when the protrusion 13a is located on the end of the recess 23a. When the height of the protrusion 13a in a protruding direction is less than the thickness of the second contact member 21, the recess 23a is formed so as to have a depth corresponding to the height of the protrusion 13a without opening the bottom surface thereof.

It is preferable to use the coil spring 31 that has rough-hewn end portions because the both end portions of the coil spring 31 are brought into contact with planes of the contact members. In particular, it is more preferable to use the coil spring 31 whose both end portions are cut at positions at which the both end portions can be in contact with respective planes of the contact members. In this way, by using the coil spring 31 with the rough-hewn end portions, it becomes not necessary to perform end-face finishing, such as end-face polishing, so that manufacturing can be made simpler.

It is preferable to adjust a distance between the coil spring 31 and each of the chamfered portions of the base end portions 13 and 23 to a distance in which the protrusion 13a is not separated from the recess 23a when the base end portions 13 and 23 come away from each other.

Figure 6:
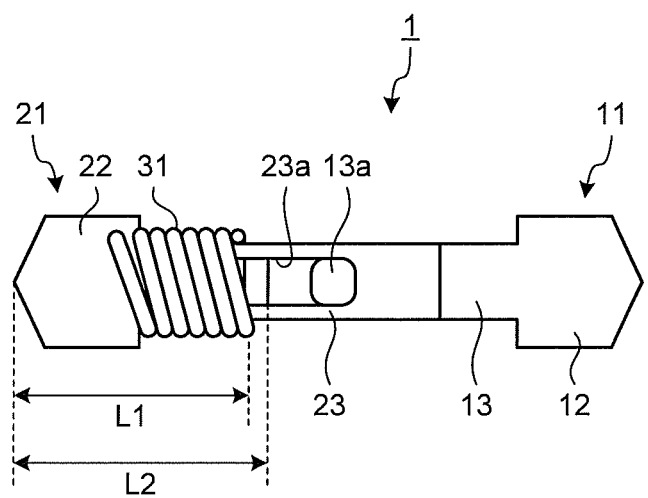
FIG. 6 is a plan view of the connection terminal according to the first embodiment of the present invention.

Compression of the coil spring 31 of the connection terminal 1 is explained below with reference to FIG. 6. FIG. 6 is a plan view illustrating a state in which the coil spring 31 is most retracted in the connection terminal 1 according to the first embodiment of the present invention. The coil spring 31 is most retracted by, for example, being compressed by the walls of the tip portion 22 at the different-level planes at the boundary between the tip portion 22 and the base end portion 23 of the second contact member 21.

At this time, a distance from the end portion of the tip portion 22 to the end portion of the coil spring 31 on the first contact member 11 side is denoted by L1. Furthermore, the maximum value of a distance between the end portion of the tip portion 22 and the end portion of the base end portion 13 on the second contact member 21 side when the protrusion 13a is fitted with the end portion of the recess 23a on the first contact member 11 side is denoted by L2. In the first embodiment, the number of turns of the coil spring 31 and the diameter of the coil spring 31 are set such that a relationship between the distance L1 and the distance L2 becomes such that L1<L2. With the relationship of L1<L2 between the distance L1 and the distance L2, it becomes possible to easily form the connection terminal 1 by firstly inserting the coil spring 31 into the base end portion 23 of the second contact member 21 and then fitting the protrusion 13a of the first contact member 11 and the recess 23a with each other.

Even when the coil spring 31 is compressed at the different-level planes on the first contact member 11 side, similarly to the above, it is possible to easily form the connection terminal 1 by adjusting the coil spring 31 so that a relationship of L3<L4 can be obtained with respect to a distance (L3) between the end portion of the tip portion 12 and the end portion of the coil spring 31 on the second contact member 21 side and the maximum value of a distance (L4) between the end portion of the tip portion 12 and the end portion of the base end portion 23 on the first contact member 11 side when the protrusion 13a is fitted with the end portion of the recess 23a on the second contact member 21.

With the above relationships, it is possible to use a circular-ring coil spring having an inner diameter approximately the same as the thickness of each of the contact members. Therefore, it becomes possible to minimize the volume of a region through which the outer edge portion of the coil spring passes, and this is advantageous when the connection terminal is used in a narrow space.

Figure 7:
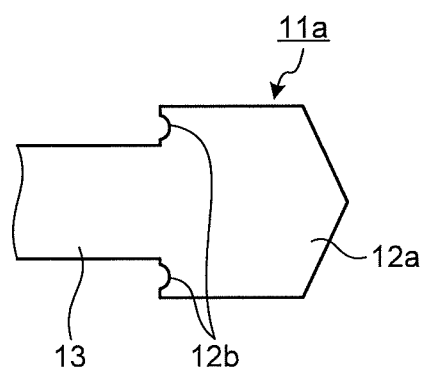
FIG. 7 is a plan view of a first modification of the connection terminal illustrated in FIG. 1.

A first modification of the connection terminal 1 is explained with reference to FIG. 7. FIG. 7 is a plan view of the first modification of the first contact member 11 of the connection terminal 1 illustrated in FIG. 1. A first contact member 11a illustrated in FIG. 7 includes notch portions 12b having arch shapes corresponding to the shape of a winding wire of the coil spring 31 on the different-level planes at the boundary between a tip portion 12a and the base end portion 13. With the notch portions 12b as described above, the coil spring 31 can be supported by the notch portions 12b, so that it becomes possible to more assuredly prevent the coil spring 31 from being detached from the first contact member 11a.

When a contact portion of the coil spring 31 is fixed at one of the different-level planes, it may be possible to form the notch portion 12b at only the different-level plane corresponding to the contact portion. The notch portion 12b may be formed in a concave shape that can support the coil spring 31. That is, the notch portions 12b can be formed in any shape as long as the notch portions can prevent the coil spring 31 from being detached from the contact members. The second contact member 21 also has the same notch portions on the different-level planes at the boundary between the tip portion 22 and the base end portion 23.

Figure 8:
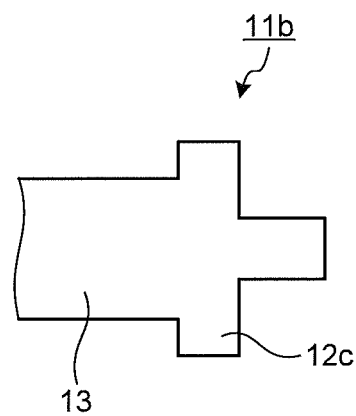
FIG. 8 is a plan view of a second modification of the connection terminal illustrated in FIG. 1.

In the first embodiment, an example is explained in which the tip of the end portion is sharply pointed. However, the shape of the tip of the end portion is not limited to this example. For example, as illustrated in FIG. 8, the end portion may be formed in a T-shape. FIG. 8 is a plan view of a second modification of the first contact member 11 of the connection terminal 1 illustrated in FIG. 1. A tip portion 12c has a tapered shape in which a bottom end of a vertical bar of a letter "T" is positioned at the tip. Furthermore, the base end portion 13 extends from an upper edge of the letter "T" of the tip portion 12c.

Figure 9:
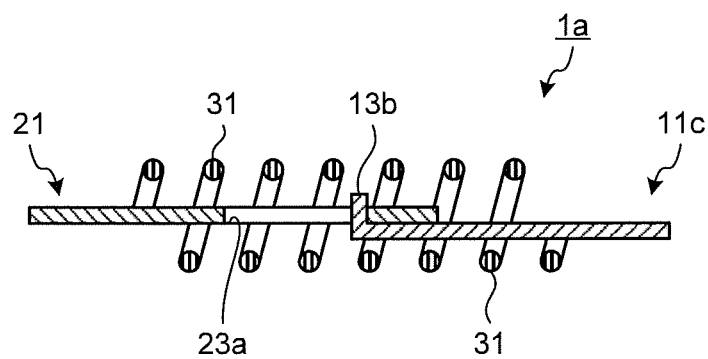
FIG. 9 is a cross-sectional view of a connection terminal according to a third modification of the first embodiment.
Figure 10:
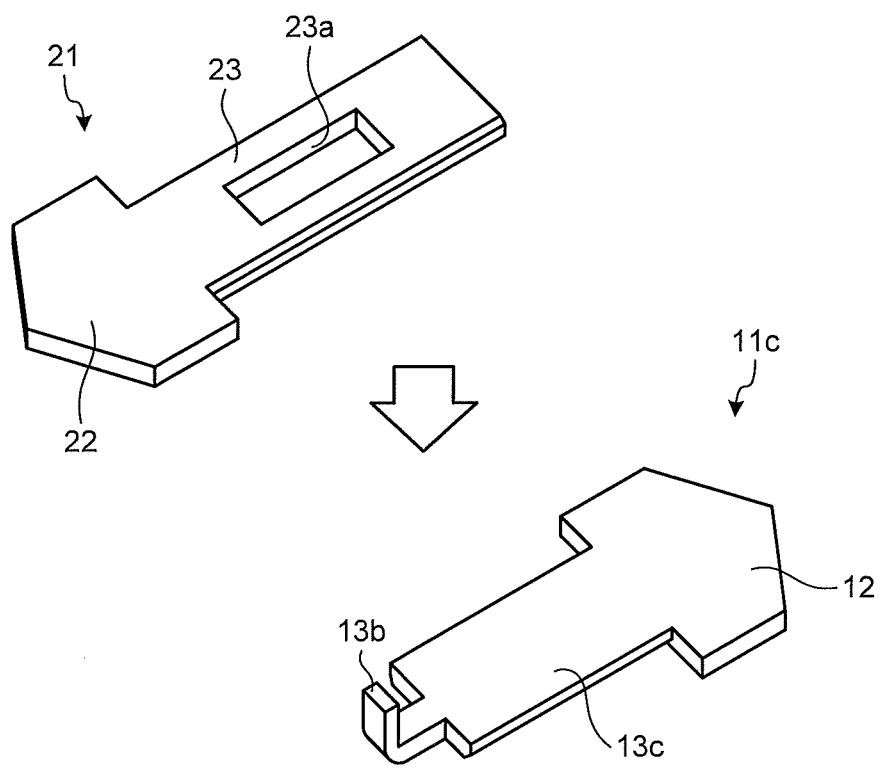
FIG. 10 is an exploded perspective view illustrating configurations of main components of the connection terminal illustrated in FIG. 9.

Modifications of the protrusion are explained with reference to FIG. 9 and FIG. 10. FIG. 9 is a cross-sectional view of a connection terminal 1a according to a third modification of the first embodiment. FIG. 10 is an exploded perspective view illustrating configurations of main components of the connection terminal 1a illustrated in FIG. 9. The connection terminal 1a illustrated in FIG. 9 and FIG. 10 includes the tip portion 12 as the first tip portion that comes in contact with a connection object to establish an electrical connection; a first contact member 11c having a base end portion 13c, which extends from a base end of the tip portion 12 and which has a protrusion 13b in a convex shape that is curved so as to be perpendicular to the plane on the end portion side that does not come in contact with the tip portion 12; the second contact member 21 described above; and the coil spring 31 described above. As illustrated in FIG. 10, the protrusion 13b has a convex shape in which a protruding portion, which protrudes from the end portion of the base end portion 13c and which has approximately the same width of the width of the recess 23a, is curved so as to be perpendicular to the plane of the first contact member 11c.

The first contact member 11c and the second contact member 21 are coupled with each other such that the inner walls of the recess 23a surround the outer side surfaces of the protrusion 13b when the protrusion 13b and the recess 23a are fitted with each other, so that it is possible to form the connection terminal 1a that can achieve the same advantages as those of the connection terminal 1 described above. Furthermore, the protrusion 13b of the first contact member 11c can more easily be formed compared with the protrusion 13a of the first contact member 11. Therefore, the connection terminal with a simpler configuration can be formed.

Figure 11:
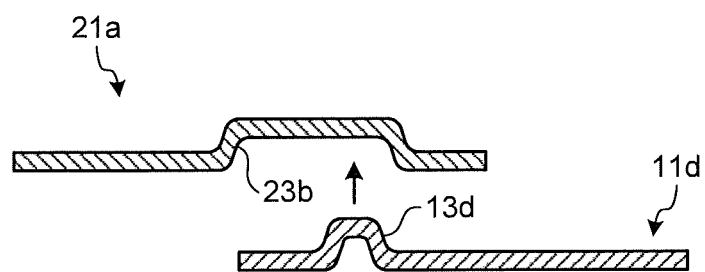
FIG. 11 is a cross-sectional view illustrating configurations of main components of a connection terminal according to a fourth modification of the first embodiment.

The protrusion may be formed in a convex shape by embossing instead of curving the end portion. FIG. 11 is a cross-sectional view illustrating configurations of main components of the connection terminal according to the fourth modification of the first embodiment. A first contact member 11d illustrated in FIG. 11 includes a protrusion 13d having a convex shape obtained by deforming the plane by embossing. A second contact member 21a includes a recess 23b having a concave shape obtained by deforming the plane by embossing in accordance with a moving range of the protrusion 13d.

The first contact member 11d and the second contact member 21a are coupled with each other such that the inner walls of the recess 23b surround the outer side surfaces of the protrusion 13d when the protrusion 13d and the recess 23b are fitted with each other, and are surrounded by the coil spring 31 described above. The configurations of the tip portions and the base end portions of the contact members are the same as those described above.

Figure 12:
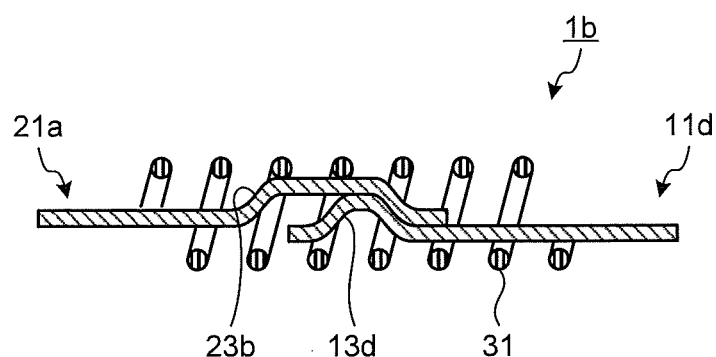
FIG. 12 is a cross-sectional view illustrating the configurations of the main components of the connection terminal according to the fourth modification of the first embodiment.

At this time, when the coil spring 31 is attached to the contact members illustrated in FIG. 11 to form a connection terminal 1b, it is preferable to attach the coil spring 31 such that the surface of the protrusion 23b and the inner surface of the coil spring 31 come into contact with each other as illustrated in FIG. 12. Accordingly, it becomes possible to more assuredly prevent the first contact member 11d and the second contact member 21a in a contact state from being separated from each other.

Figure 13:
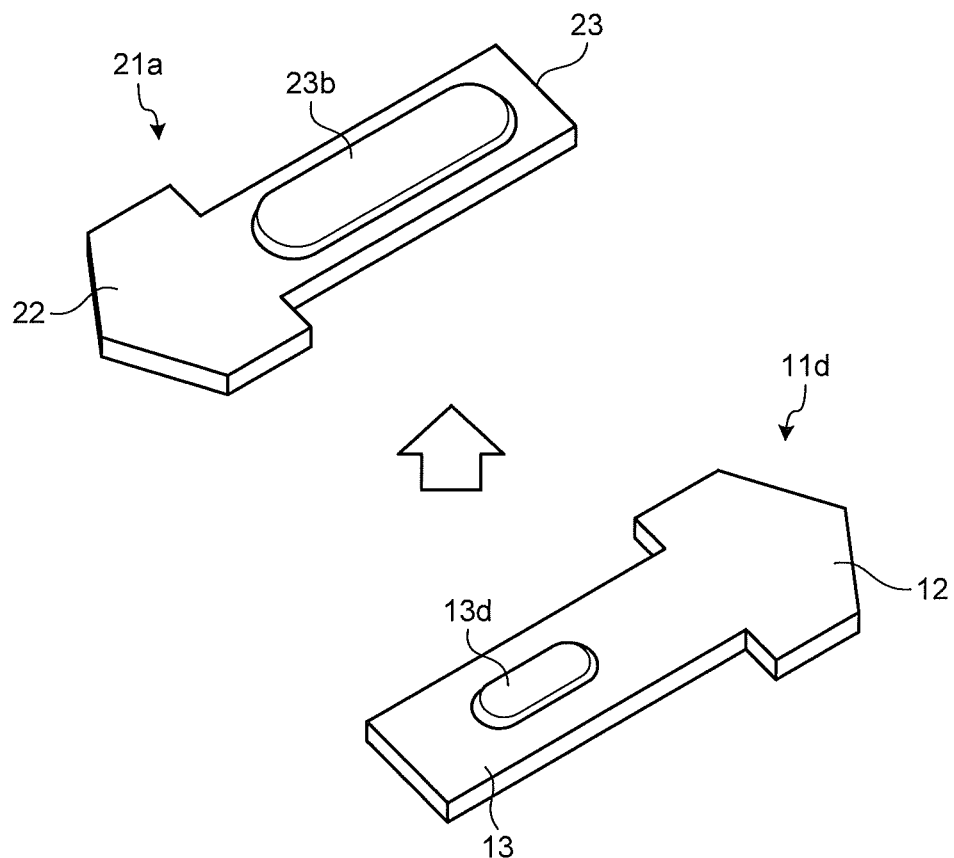
FIG. 13 is an exploded perspective view illustrating the configurations of the main components of the connection terminal according to the fourth modification of the first embodiment.

As illustrated in FIG. 13, it is preferable to perform the embossing (formation of the protrusions) at portions of the first contact member 11d and the second contact member 21a in the width direction. When the protrusion 23b and the coil spring 31 can come in contact with each other, it is possible to perform embossing on the entire contact members in the width direction to form the protrusions. It is possible to apply a configuration in which the protrusion 23b and the coil spring 31 do not come into contact with each other.

Figure 14:
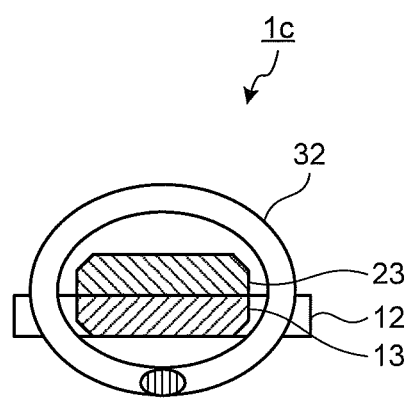
FIG. 14 is a cross-sectional view of a connection terminal according to a fifth modification of the first embodiment.
Figure 15:
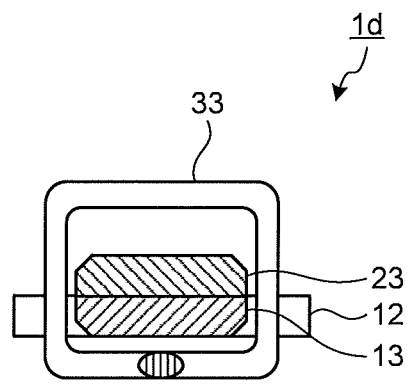
FIG. 15 is a cross-sectional view of a connection terminal according to a sixth modification of the first embodiment.

A modification of the coil spring is explained below with reference to FIG. 14 to FIG. 17. FIG. 14 is a cross-sectional view of a connection terminal 1c according to a fifth modification of the first embodiment. FIG. 15 is a cross-sectional view of a connection terminal 1d according to a sixth modification of the first embodiment.

As illustrated in FIG. 14, the connection terminal 1c includes a coil spring 32 made of a wire rod wound in an elliptical shape. The long inner diameter of the ellipse is equal to or greater than the width of each of the base end portions 13 and 23 illustrated in FIG. 1 and less than the width of each of the tip portions 12 and 22. The coil spring 32 is disposed so that the long diameter is parallel to the width direction of the connection terminal 1c.

As illustrated in FIG. 15, the connection terminal 1d includes a coil spring 33 made of a wire rod wound in a rectangular shape. The inner long side of the rectangle is equal to or greater than the width of each of the base end portions 13 and 23 illustrated in FIG. 1 and less than the width of each of the tip portions 12 and 22. The coil spring 33 is disposed so that the long side is parallel to the width direction of the connection terminal 1d.

As in the connection terminals 1c and 1d according to the fifth and the sixth modifications described above, by reducing the length of the coil spring in the direction perpendicular to the width direction of the tip compared with the coil spring that is wound in a circular shape, it becomes possible to reduce the volume of the connection terminal, enabling to reduce a size of the structure of an apparatus including the connection terminal.

Figure 16:
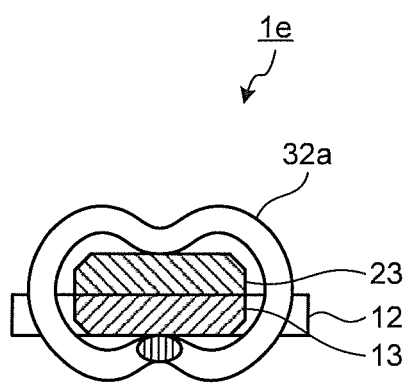
FIG. 16 is a cross-sectional view of a connection terminal according to a seventh modification of the first embodiment.
Figure 17:
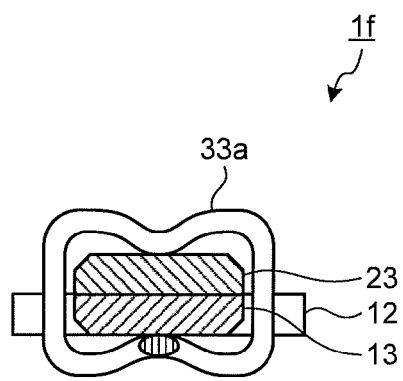
FIG. 17 is a cross-sectional view of a connection terminal according to an eighth modification of the first embodiment.

FIG. 16 is a cross-sectional view of a connection terminal 1e according to a seventh modification of the first embodiment. FIG. 17 is a cross-sectional view of a connection terminal if according to an eight modification of the first embodiment.

As illustrated in FIG. 16, the connection terminal 1e includes a coil spring 32a made of a wire rod that is wound in an approximately elliptical shape with recesses on the long sides. The long inner diameter of the coil spring is equal to or greater than the width of each of the base end portions 13 and 23 illustrated in FIG. 1 and less than the width of each of the tip portions 12 and 22. The coil spring 32a is disposed such that the long diameter becomes parallel to the width direction of the connection terminal 1e. The coil spring 32a is attached to the contact members such that the recesses are located on the plane sides of the base end portions 13 and 23. The length between the recesses in a direction perpendicular to the winding direction is the same as the thickness of the contact portion of the base end portion 13 and the base end portion 23. Therefore, a part of the inner circumference of the coil spring 32a comes in contact with the base end portion 13 and the base end portion 23.

As illustrated in FIG. 17, the connection terminal if includes a coil spring 33a made of a wire rod that is wound in an approximately rectangular shape with recesses in the long sides. The long inner diameter of the coil spring is equal to or greater than the width of each of the base end portions 13 and 23 illustrated in FIG. 1 and less than the width of each of the tip portions 12 and 22. The coil spring 33a is disposed such that the long diameter becomes parallel to the width direction of the connection terminal 1f. The coil spring 33a is attached to the contact member. The length between the recesses in a direction perpendicular to the winding direction is the same as the thickness of the contact portion of the base end portion 13 and the base end portion 23. Therefore, a part of the inner circumference of the coil spring 33a comes in contact with the base end portion 13 and the base end portion 23.

As in the connection terminals 1e and 1f according to the seventh and the eighth modifications described above, by forming the recesses on the coil spring such that the length of the interval between the recesses is the same as the thickness of the contact portion of the base end portion 13 and the base end portion 23, the contact state between the base end portion 13 and the base end portion 23 can be more secured.

Figure 18:
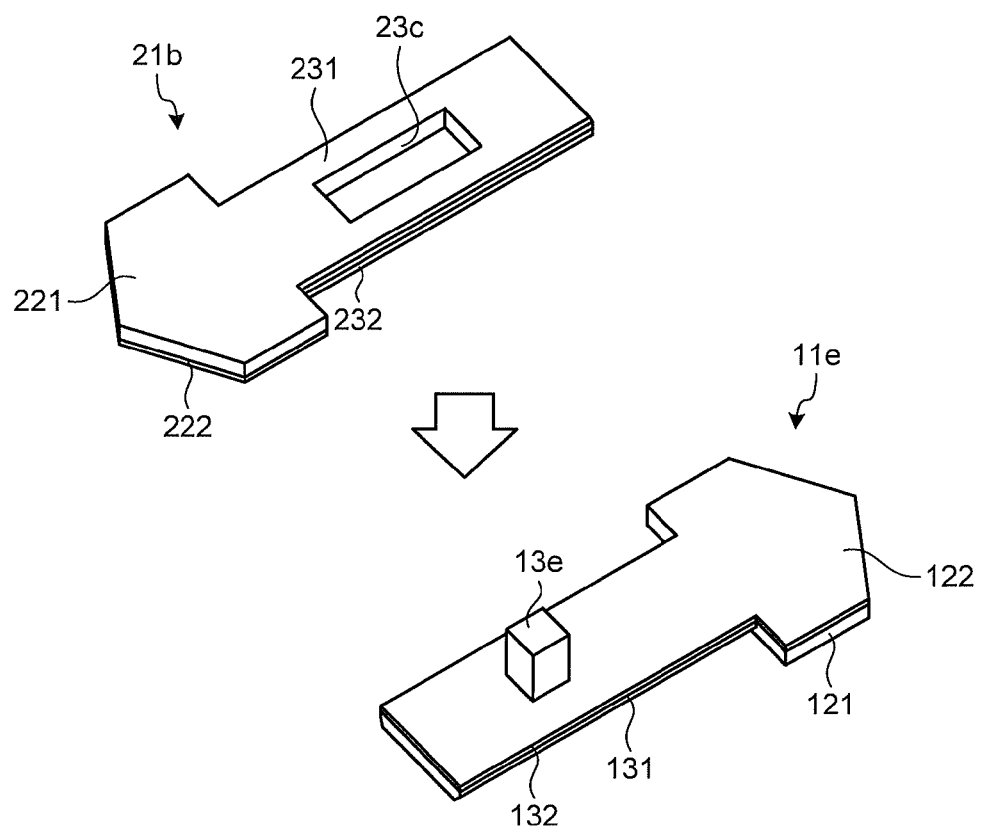
FIG. 18 is an exploded perspective view illustrating configurations of main components of a connection terminal according to a ninth modification of the first embodiment.

The first contact member and the second contact member described above are preferably made of a material with a good conductive property, such as copper, copper alloy, or aluminum, and a contact surface of the first contact member and the second contact member is preferably plated with noble metal or noble metal alloy with stable contact resistance, such as gold, silver, or palladium. As illustrated in FIG. 18, it is possible to use a clad material, in which noble metal or noble metal alloy, such as gold, silver, or palladium, with stable contact resistance is deposited.

FIG. 18 is an exploded perspective view illustrating configurations of main components of a connection terminal according to a ninth modification of the first embodiment. A first contact member 11e illustrated in FIG. 18 includes a first tip portion, which has a polygonal shape, a tip of which in the longitudinal direction is sharply pointed, and which comes in contact with a connection object to establish an electrical connection; and a first base end portion, which comes in contact with a second contact member 21b to enable an electrical connection with the second contact member 21b. The first tip portion has a flat plate shape, in which a tip conducive portion 121 made of copper, copper alloy, or aluminum and a tip sliding portion 122 made of gold, silver, or palladium are deposited one on top of the other. The first base end portion is a flat plate, which has an approximately rectangular solid shape extending from a base end of the tip portion and in which a base-end conductive portion 131 made of copper, copper alloy, or aluminum and a base-end sliding portion 132 made of gold, silver, or palladium are deposited one on top of the other. The first base end portion includes a protrusion 13e, which has an approximately bar shape protruding from the surface of the base-end sliding portion 132 in a direction perpendicular to the plane.

Meanwhile, the second contact member 21b includes a second tip portion, which has a polygonal shape, a tip of which in the longitudinal direction is sharply pointed, and which comes in contact with a connection object to establish an electrical connection; and a second base end portion, which comes in contact with the first contact member 11e to enable an electrical connection with the first contact member 11e. The second end portion has a flat plate shape, in which a tip conductive portion 221 made of copper or the like and a tip sliding portion 222 made of gold, silver, or palladium are deposited one on top of the other. The second base end portion is a flat plate, which has an approximately rectangular solid shape extending from a base end of the tip portion and in which a base-end conductive portion 231 made of copper, copper alloy, or aluminum and a base-end sliding portion 232 made of gold, silver, or palladium are deposited one on top of the other. The second base end portion includes a recess 23c that has the same width as the width of the protrusion 13e and that is fitted with the protrusion 13e such that the protrusion 13e can slide in the longitudinal direction of the base end portion.

The first contact member 11e and the second contact member 21b are coupled with each other such that the inner walls of the recess 23c surround the outer side surfaces of the protrusion 13e when the protrusion 13e and the recess 23c are fitted with each other, and the base-end sliding portions 132 and 232, which are made of noble metal or noble metal alloy with stable contact resistance, such as gold, silver, or palladium, come in contact with each other. Therefore, it is possible to more stabilize the electrical continuity.

Second Embodiment

Figure 19:
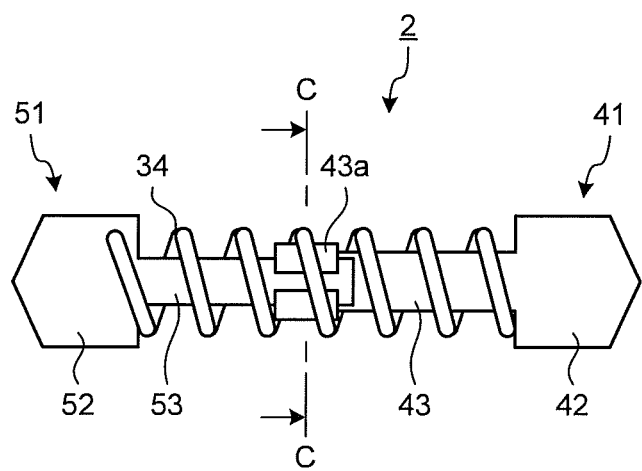
FIG. 19 is a plan view illustrating a configuration of a connection terminal according to a second embodiment of the present invention.
Figure 20:
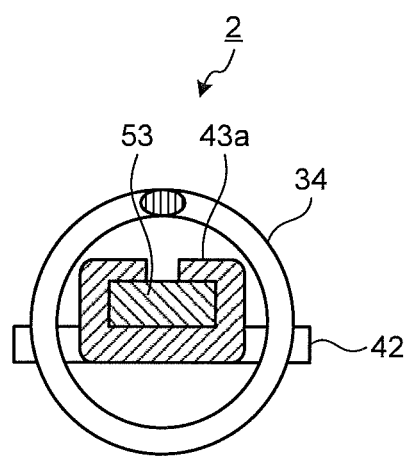
FIG. 20 is a cross-sectional view of the connection terminal illustrated in FIG. 19, taken along a line C-C.

A second embodiment of the present invention will be explained below with reference to FIG. 19 and FIG. 20. FIG. 19 is a plan view illustrating a configuration of a connection terminal 2 according to the second embodiment of the present invention. FIG. 20 is a cross-sectional view of the connection terminal 2 illustrated in FIG. 19, taken along a line C-C. The connection terminal 2 illustrated in FIG. 19 and FIG. 20 comes in contact with connection objects at both ends thereof to establish electrical continuity between the connection objects.

The connection terminal 2 includes a first contact member 41, which has an approximately plate shape, which has a conductive property, and one end of which can be brought into contact with and electrically connected to a connection object; a second contact member 51, which has an approximately plate shape, which has a conductive property, one end of which can be brought into contact with and electrically connected to a connection object, and which can establish electrical continuity between the connection objects by being coupled with the first contact member 41; and an extendable-retractable coil spring 34, which applies a biasing force along the longitudinal directions of the first contact member 41 and the second contact member 51.

The first contact member 41 includes a tip portion 42 that comes in contact with a connection object to establish an electrical connection; and a base end portion 43 that comes in contact with the second contact member 51 to enable an electrical connection with the second contact member 51. The tip portion 42 has a polygonal shape, a tip of which in the longitudinal direction of the first contact member 41 is sharply pointed. The base end portion 43 is a flat plate having an approximately rectangular solid shape extending from a base end of the tip portion 42. The width of an end portion of the base end portion 43 opposite the tip portion 42 is less than the width of the tip portion 42. The width of an end portion of the base end portion 43 opposite the tip portion 42 is greater than the width of the base end portion 43 on the tip portion 42 side, and a protrusion 43a, in which a portion protruding farther than the width of the tip portion 42 side is curved in a direction perpendicular to the plane of the base end portion 43. The first contact member 41 has a mirror-symmetric shape with respect to a plane that passes the tip of the tip portion 42, that is parallel to the longitudinal direction of the first contact member 41, and that is perpendicular to the plane of the first contact member 41.

The second contact member 51 includes a tip portion 52 that comes in contact with a connection object to establish an electrical connection; and a base end portion 53 that comes in contact with the first contact member 41 to enable an electrical connection with the first contact member 41. The tip portion 52 has a polygonal shape, a tip of which in the longitudinal direction of the second contact member 51 is sharply pointed. The base end portion 53 is a flat plate having an approximately rectangular solid shape extending from a base end of the tip portion 52. The width of the base end portion 53 is less than the width of the tip portion 52 and is the same as the width of a space formed at the curved portion of the protrusion 43a. The second contact member 51 has a mirror-symmetric shape with respect to a plane that passes the tip of the tip portion 52, that is parallel to the longitudinal direction of the second contact member 51, and that is perpendicular to a plane of the second contact member 51.

Figure 21:
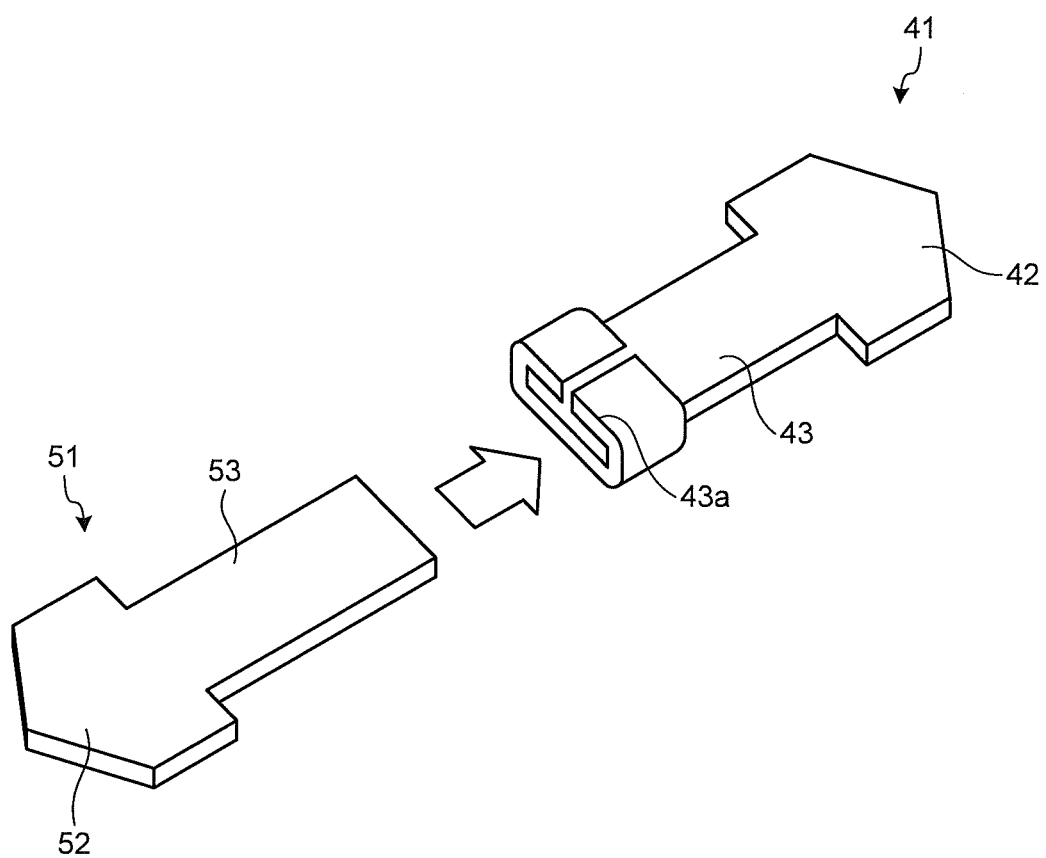
FIG. 21 is an exploded perspective view illustrating configurations of main components of the connection terminal illustrated in FIG. 19.

FIG. 21 is an exploded perspective view illustrating configurations of main components of the connection terminal 2 illustrated in FIG. 19. The first contact member 41 and the second contact member 51 are coupled with each other such that the inner walls of the protrusion 43a surround the outer circumference of the base end portion 53 when the base end portion 53 of the second contact member 51 is inserted in the protrusion 43a, and opposing surfaces of the base end portions 43 and 53 come in contact with each other to enable electrical continuity between the first contact member 41 and the second contact member 51.

The protrusion 43a is formed such that a space formed by planes of the curved base end portion 43 are curved in accordance with the cross section perpendicular to the longitudinal direction of the base end portion 53. Because the protrusion 43a has the space corresponding to the base end portion 53, the first contact member 41 and the second contact member 51 come into contact with each other not only at the opposing surfaces of the base end portion 43 and the base end portion 53 but also at the inner surface of the curved portion of the protrusion 43a and the side surfaces and upper surface of the base end portion 53. Therefore, electrical continuity between the first contact member 41 and the second contact member 51 can be more ensured.

As illustrated in FIG. 20, the coil spring 34 is made of a wire rod that is wound in a circular ring shape with an inner diameter that is slightly greater than the width of the protrusion 43a. As illustrated in FIG. 19 and FIG. 20, the coil spring 34 surrounds the base end portions 43 and 53 while the first contact member 41 and the second contact member 51 are fitted with each other. One end side of the coil spring 34 comes in contact with a different-level surfaces formed at the boundary between the tip portion 42 and the base end portion 43 and applies an elastic force to the tip portion 42 side of the first contact member 41. Similarly, the other end side of the coil spring 34 comes in contact with a different-level surface formed at the boundary between the tip portion 52 and the base end portion 53 and applies an elastic force to the tip portion 52 side of the second contact member 51.

The connection terminal 2 according to the second embodiment described above can be formed in a simple structure and assuredly enable electrical continuity by bringing the contact members in surface contact with each other. The inner space of the protrusion 43a can be adjusted by adjusting the degree of curve of the protruding portion. Therefore, it is not necessary to strictly manage the diameter, enabling to make the manufacturing easy.

INDUSTRIAL APPLICABILITY

As described above, the connection terminal according to the present invention is useful for connecting electrical circuit boards to establish electrical continuity.

REFERENCE SIGNS LIST 1, 1a, 1b, 1c, 1d, 1e, 1f, 2 CONNECTION TERMINAL
11, 11a, 11b, 11c, 11d, 11e, 41 FIRST CONTACT MEMBER
12, 12a, 12c, 22, 42, 52 TIP PORTION
12b NOTCH PORTION
13, 13c, 23, 43, 53 BASE END PORTION
13a, 13b, 13d, 13e PROTRUSION
21, 21a, 21b, 51 SECOND CONTACT MEMBER
23a, 23b, 23c RECESS
31, 32, 32a, 33, 33a, 34 COIL SPRING
121, 221 TIP CONDUCTIVE PORTION
122, 222 TIP SLIDING PORTION
131, 231 BASE-END CONDUCTIVE PORTION
132, 232 BASE-END SLIDING PORTION

The invention claimed is:

1. A connection terminal comprising:
a first contact member that has a conducive property and that has an approximately plate shape, the first contact member including:
a first tip portion, a tip of which is sharply pointed;
a first base end portion, a width of which is less than a width of the first tip portion and which extends from a base end of the first tip portion; and
a protrusion protruding in a direction perpendicular to one plane of the base end portion;
a second contact member that has a conducive property and that has an approximately plate shape, the second contact member including:
a second tip portion, a tip of which is sharply pointed; and
a second base end portion, a width of which is less than a width of the second tip portion and which extends from a base end of the second tip portion, wherein the second contact member slides against the protrusion in a direction in which the second base end portion extends; and
a coil spring that surrounds the first base end portion and the second base end portion and biases the first contact member and the second contact member toward the first tip portion and the second tip portion, respectively, wherein
one of the protrusion and the second base end portion surrounds at least a part of an outer circumference of the other one of the protrusion and the second base end portion.

2. The connection terminal according to claim 1, wherein a surface of each of the first base end portion and the second base end portion, the surface being not in contact with the first base end portion or the second base end portion and being parallel to the longitudinal direction, is chamfered.

3. The connection terminal according to claim 1, wherein each of the first base end portion and the second base end portion is a clad material, in which a sliding portion and a conductive portion are deposited one on top of the other, wherein
the sliding portion is made of noble metal or noble metal array and is in contact with the first base end portion and the second base end portion, and
the conductive portion is made of a conductive material and with which the first base end portion and the second base end portion does not come in contact.

4. The connection terminal according to claim 1, wherein the second contact member includes a recess with which the protrusion is fitted such that the protrusion can slide in the direction in which the second base end portion extends.

5. The connection terminal according to claim 4 wherein a bottom surface of the recess is open.

6. The connection terminal according to claim 1, further comprising different-level planes at a boundary between the first end portion and the first base end portion and between the second end portion and the second base end portion, each of the different-level planes including a notch portion in a shape corresponding to a winding of the coil spring.

7. The connection terminal according to claim 6, wherein when the coil spring is separated from one of the first contact member and the second contact member and is most retracted toward the other one of the first contact member and the second contact member, a distance from a tip of the other one of the first contact member and the second contact member to an end of the coil spring is less than a maximum value of a distance from a tip of the other one of the first contact member and the second contact member to a fitted portion between the first contact member and the second contact member.

8. The connection terminal according to claim 1, wherein at least portions of the coil spring in contact with the first contact member and the second contact member have insulation properties.

9. The connection terminal according to claim 8, wherein an entire surface of the coil spring has an insulation property.

10. The connection terminal according to claim 1, wherein one end of the coil spring is in contact with one plane of the first tip portion and the other end of the coil spring is in contact with one plane of the second end portion.

11. The connection terminal according to claim 10, wherein a part of an inner surface of the coil spring is in contact with a surface of the protrusion that is not in contact with the second contact member.

12. The connection terminal according to claim 10, wherein a part of the inner surface of the coil spring is in contact with a surface of the first contact member being not in contact with the second contact member and is in contact with a surface of the second contact member being not in contact with the first contact member.

13. The connection terminal according to claim 10, wherein when the coil spring is separated from one of the first contact member and the second contact member and is most retracted toward the other one of the first contact member and the second contact member, a distance from a tip of the other one of the first contact member and the second contact member to an end of the coil spring is less than a maximum value of a distance from a tip of the other one of the first contact member and the second contact member to a fitted portion between the first contact member and the second contact member.

* * * * *